United States Patent [19]

Kawasaki et al.

[11] Patent Number: 5,463,276
[45] Date of Patent: Oct. 31, 1995

[54] DOUBLE-FACED VACUUM FLUORESCENT DISPLAY

[75] Inventors: Hiroaki Kawasaki; Hiroshi Sakurada; Shinichi Narushima; Tadashi Iwasa; Hiroshi Yamaguchi, all of Mobara, Japan

[73] Assignee: Futaba Corporation, Mobara, Japan

[21] Appl. No.: 154,031

[22] Filed: Nov. 18, 1993

[30] Foreign Application Priority Data

| | | | |
|---|---|---|---|
| Nov. 19, 1992 | [JP] | Japan | 4-80061 U |
| Dec. 2, 1992 | [JP] | Japan | 4-83276 U |
| Dec. 3, 1992 | [JP] | Japan | 4-83506 U |
| Apr. 28, 1993 | [JP] | Japan | 5-22655 U |
| Aug. 31, 1993 | [JP] | Japan | 5-47408 U |

[51] Int. Cl.⁶ ............................................. H01J 1/62
[52] U.S. Cl. .................. 313/496; 313/293; 313/303; 313/493
[58] Field of Search ................... 313/495, 496, 313/497, 293, 323, 493; 345/55

[56] References Cited

U.S. PATENT DOCUMENTS

| | | | |
|---|---|---|---|
| 4,472,658 | 9/1984 | Morimoto et al. | 313/497 |
| 4,617,491 | 10/1986 | Kishino et al. | 313/497 |
| 4,661,743 | 4/1987 | Matsuoka et al. | 313/496 |
| 5,150,005 | 9/1992 | Yokono | 313/495 |
| 5,172,028 | 12/1992 | Watanabe | 313/495 |
| 5,198,723 | 5/1993 | Parker | 313/493 |
| 5,256,936 | 10/1993 | Itoh et al. | 313/495 |
| 5,270,613 | 12/1993 | Kim | 313/496 |
| 5,304,895 | 4/1994 | Ujihara | 313/498 |

FOREIGN PATENT DOCUMENTS

| | | |
|---|---|---|
| 54-011661 | 1/1979 | Japan . |
| 55-043757 | 3/1980 | Japan . |
| 56-11988 | 3/1981 | Japan . |
| 58-021946 | 8/1981 | Japan . |
| 59-059459 | 4/1984 | Japan . |
| 59-111239 | 6/1984 | Japan . |
| 59-121744 | 7/1984 | Japan . |
| 01-075956 | 5/1989 | Japan . |
| 02-117654 | 9/1990 | Japan . |
| 2117654 | 9/1990 | Japan .............................. H01J 31/15 |
| 4-360126 | 12/1992 | Japan . |

Primary Examiner—Donald J. Yusko
Assistant Examiner—Michael H. Day
Attorney, Agent, or Firm—Kanesaka & Takeuchi

[57] ABSTRACT

A double-faced vacuum fluorescent display of the invention is formed of an outer casing, and first and second display portions. The outer casing includes a base plate, a transparent front plate situated in front of the base plate, and a side member situated between the base plate and the front plate to form a space therebetween. The first display portion is mounted on the base plate, and includes a wiring pattern, an insulating layer with light shielding property, a first anode conductor and a first fluorescent layer. A display on the first display portion can be observed only from the front plate side. The second display portion is mounted on the transparent front plate, and includes a second anode conductor with transparency and a second fluorescent layer. The second display portion has a light transmitting portion for observing the first display portion therethrough. Light by the first fluorescent layer is observed from the light transmitting portion through the transparent front plate, and light by the second fluorescent layer is seen through the transparent front plate and the second anode conductor.

10 Claims, 16 Drawing Sheets

F I G. 1 8 (a)
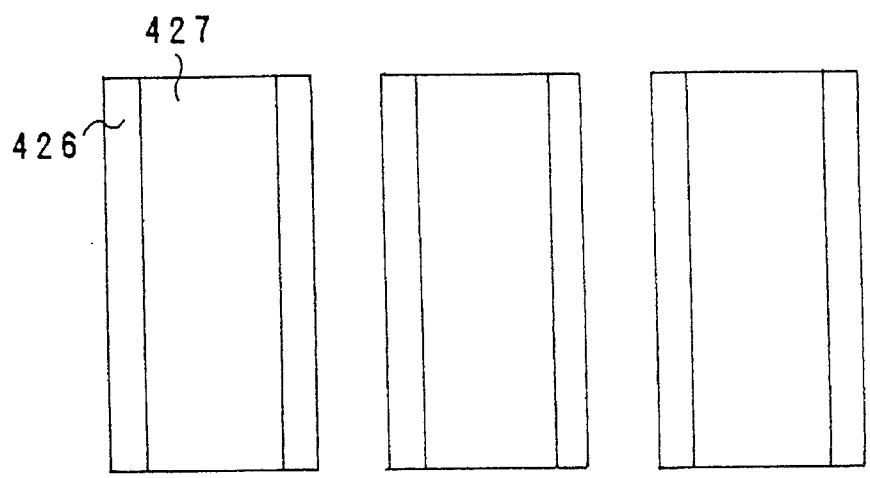
F I G. 1 8 (b)
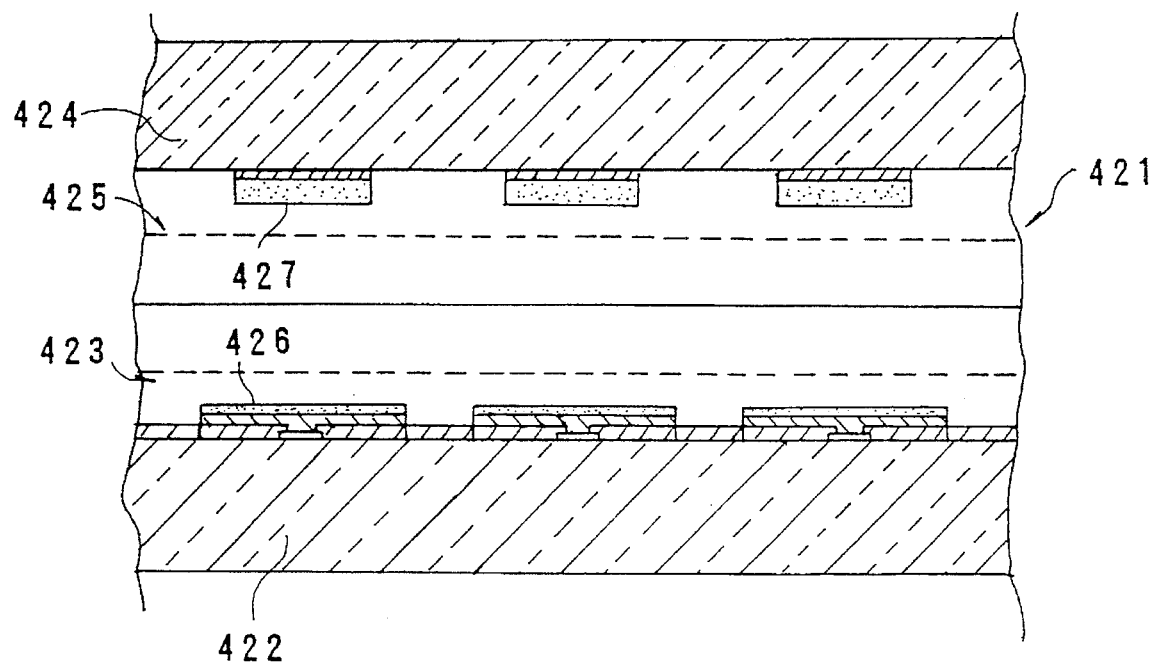

451
455, 457
453, 456

| G | R | G | B | G |

DOUBLE-FACED VACUUM FLUORESCENT DISPLAY

BACKGROUND OF THE INVENTION

1. Field of the Invention

This invention relates to a double-faced vacuum fluorescent display in which luminescent display portions take place on both sides of an outer casing.

2. Description of the Related Art

A double-faced vacuum fluorescent display is currently known in which luminescent display portions are mounted on an outer casing at a base-plate side and a front-plate side facing the base-plate side, respectively, so that a luminescent material of these display portions can be observed from the front-plate side. This kind of double-faced vacuum fluorescent display is disclosed in, for example, Japanese Patent Publication No. SHO 56-11988. FIG. 25 of the accompanying drawings shows this double-faced vacuum fluorescent display. According to this publication, the combination of display patterns of the two luminescent display portions is exemplified by a combination of a digital display and an analog display, a combination of the digital or analog display and a special pattern display, and a combination of the digital display and digital display. In the combination of the two digital displays, character segments are mounted respectively on the front-plate side and the base-plate side and display so as not to overlap with each other in an effort to minimize interdigit spaces. This publication is totally silent about the kind of fluorescence.

The front plate of the double-faced vacuum fluorescent display of FIG. 25 has a flat-bottomed boat-shape molded front 1, and a wiring pattern 3 leading to the base-plate side 2 is formed on the inner surface of the molded front 1 by indium-tin oxide.

However, since the molded front 1 requires necessarily a mold, the prior display is expensive. Consequently an assembled front has been widely used recently in which frame-like side plates are combined with the front plate. With the assembled front, unlike the molded front, the wiring method was difficult to achieve. To this end, as disclosed in Japanese Patent Laid-Open Publication No. SHO 59-111239 and as shown in FIG. 26, wires lead to the front plate 4 and the base plate 5 and various external terminals 6, 7 are attached thereto.

In this prior double-faced vacuum fluorescence display, a frame-shape insulating film is formed over the outer peripheral portion of the front plate in order to secure insulation between the wires connected to the electrodes, etc. and shield external light. Also, on the base-plate side, an insulating film is formed under the display portion over the substantially entire surface.

As shown in FIGS. 27 and 28, a getter 9 is mounted in the outer casing of the prior double-faced vacuum fluorescent display. The getter is mounted on a non-illustrated spacer frame, which extends on and along the inner surface of the back base plate 10, via a support member 11. To this getter 9, electrodes of a high-frequency induction heater are brought closely from an outside of the outer casing 8 to radiate high frequency waves. As a getter container is heated, a getter material will be evaporated so that a getter film is formed over the inner surface (over the insulating film 13) of the front base plate 12 facing the getter 9.

SUMMARY OF THE INVENTION

It is therefore an object of this invention to increase convenience in practical use of a double-faced vacuum fluorescent display by improving the arrangement of the external terminals and the contact with the terminals in an outer casing and by realizing a variety of display with two display portions.

According to a first aspect of the invention, there is provided a double-faced vacuum fluorescent display, comprising: an outer casing including a base plate, a front plate facing said base plate, and a side member disposed between said base plate and said front plate; a first display portion mounted on an inner surface of said face plate; and a second display portion mounted on an inner surface of said front plate with a gap or a light transmitting portion from which said first display portion can be observed.

According to a second aspect of the invention, a double-faced vacuum fluorescent display comprises a number of external terminals extending through the outer casing, and a number of terminal portions mounted on said front plate to which inner ends of said external terminals are connected, wherein at least a part of said terminal portions are transparent so that at least a part of the inner ends of said external terminals can be observed through said front plate and said terminal portions.

According to a third aspect of the invention, in a double-faced vacuum fluorescent display of the second aspect of the invention, at least a part of said terminal portions is surrounded by a frame, an inside of which is transparent.

With the first to third arrangements, the first and second display portions have substantially the same display range. In the manufacturing process, the front place is placed over the side plate on the base plate, with the external terminals sandwiched between the front plate and the slide plate. Since the inner ends of the external terminals can be observed from the transparent terminal portion formed in the front plate, it is possible to align the external terminals with the terminal portions of the front plate precisely.

According to a fourth aspect of the invention, the double-faced vacuum fluorescent display comprising: an outer casing including a base plate, a front plate facing the base plate and a side plate between the base plate and the front plate; a base-plate-side terminal connected to the first display portion mounted on the inner surface of the base plate; a front-plate-side terminal connected to the second display portion mounted on the inner surface of the front plate; an external terminal clamped between one of either of the base plate or the front plate and the side plate and contacting the base-plate-side terminal in the outer casing; and an external terminal contacting the front-plate-side terminal in the outer casing.

According to a fifth aspect of the invention, the double-faced vacuum fluorescent display comprises: an outer casing including a base plate, a transparent front plate facing the base plate, and a side plate between the base plate and the front plate; a base-plate-side terminal connected to a first wiring pattern mounted on the inner surface of the base plate; an insulating layer covering the first wiring pattern on the base plate; a first display portion including a first anode conductor mounted on the insulating layer on the base plate and connected to the first wiring pattern, and a first fluorescent layer mounted on the first anode conductor; a first mesh grid at a predetermined distance away from the display portion; a front-plate-side terminal connected to a second wiring pattern mounted on the inner surface of the front plate; a second display portion including a transparent second anode conductor connected to the second wiring pattern on the front plate, and a second fluorescent layer mounted on the second anode conductor; a second mesh grid at a predetermined distance away from the second display portion; an external terminal clamped between one of either of the base plate or the front plate and the side plate and contacting the base-plate-side terminal in the outer casing; and an external terminal contacting the front-plate-side terminal in the outer casing.

With the fourth and fifth aspects, since the shapes of the external terminals have different shapes according to whether they are to be connected to the base-plate side or the front-plate side, it is possible to clamp all of the external terminals between one of either base plate or the front plate and the slide plate and to arrange the external terminals in a row.

According to a sixth aspect of the invention, in the double-faced vacuum fluorescent display, at least the front plate and/or the base plate has a shield film over a peripheral portion of the inner surface, the shield film having a through-hole at a portion facing the external terminal in the outer casing so that the external terminal can be observed from the outer casing.

According to a seventh aspect of the invention, in the double-faced vacuum fluorescent display, the shield film on the side of the front plate facing the base-plate-side terminal has a through-hole through which the external terminal can be observed.

According to an eighth aspect of the invention, in the double-faced vacuum fluorescent display, the shield film on the side of the base plate facing the front-plate-side terminal has a through-hole through which the external terminal can be observed.

According to a ninth aspect of the invention, in the double-faced vacuum fluorescent display, the shield film on the side of the front plate facing the base-plate-side terminal and the shield film on the side of the base plate facing the front-plate-side terminal have through-holes through which the external terminals can be observed.

According to a tenth aspect of the invention, in the double-faced vacuum fluorescent display, the through-hole in the shield film on the front plate is a slot continuous in the direction parallel to the individual terminals of the base plate.

According to an eleventh aspect of the invention, in the double-faced vacuum fluorescent display, the through-holes in the shield film on the base plate are arranged at the same pitch and in the same direction parallel to the individual terminals arranged on the base plate.

With the sixth to eleventh aspects, the contact between the terminal of the back base plate and the external lead wire can be observed through the through-hole formed in the shield film of the front base plate. The contact between the terminals of the front base plate and the external lead wire can be observed through the through-hole formed in the shield film of the back base plate.

According to a twelfth aspect of the invention, in the double-faced vacuum fluorescent display, the first display portion and the second display portion are arranged so as to overlap with each other at least in part in the direction of observation.

According to a thirteenth aspect of the invention, in the double-faced vacuum fluorescent display, either the first display portion or the second display portion has a fluorescence containing only sulfide.

According to a fourteenth aspect of the invention, in the double-faced vacuum fluorescent display, the first display portion and the second display portion are formed of the same type.

With the twelfth to fourteenth aspects, since the first and second display portions made of the same type, namely, substantially identical or analogous in shape with each other are arranged so as to partially overlap with each other, the observer sees two display portions of substantially identical patterns in substantially the same position. If the two display portions have different colors, the color shift display in the same pattern can be made by turning on only one display portion, and the different color display in the same pattern can be made by simultaneously turning on the two display portions.

According to a fifteenth aspect of the invention, the double-faced vacuum fluorescent display further comprises a shield film mounted over all the portions except the first and second display portions, a getter situated contiguously to the shield film, a getter-film-covered portion free of the shield film and defined by a part of the inner surface of the outer casing facing the getter, and a getter film mounted on the getter-film-covered portion.

With the fifteenth arrangement, since the getter can be observed from the getter-film-covered portion of the outer casing from which the insulating film is removed, it is possible to heat only the getter precisely. Further, since the getter film is formed on the getter-film-covered portion, it is possible to recognize the getter film from the outside of the outer casing.

BRIEF DESCRIPTION OF THE DRAWINGS

FIGS. 18(a) and 18(b) are a schematic plan view and a schematic cross-sectional view showing a modified form of the fourth embodiment;

DETAILED DESCRIPTION

Figure 26:
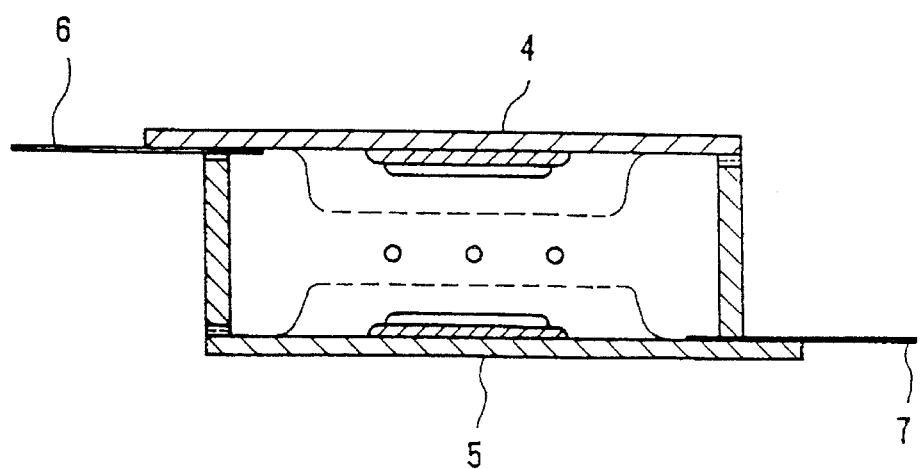
FIG. 26 is a cross-sectional view of another conventional double-faced vacuum fluorescent display.
Figure 27:
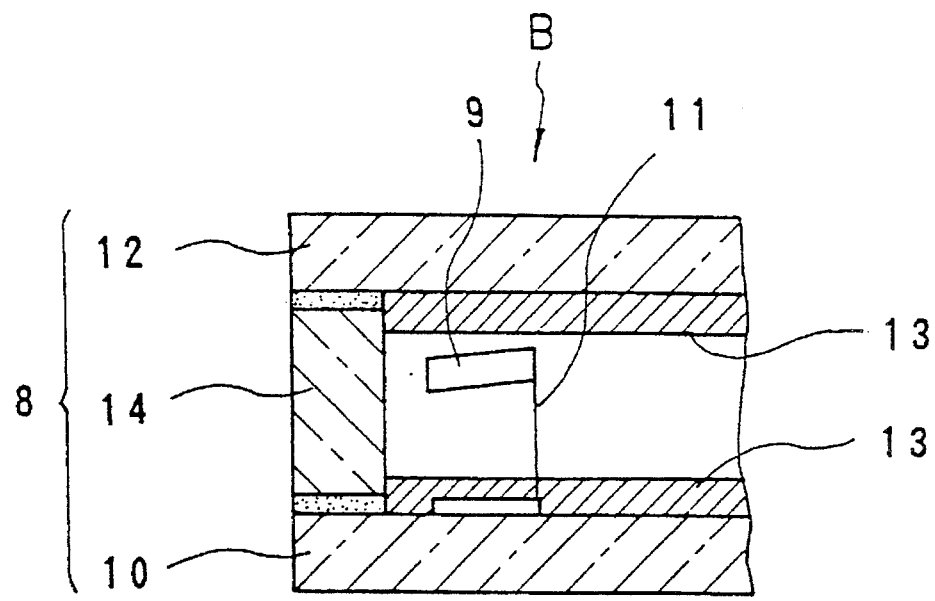
FIG. 27 is a cross-sectional view of still another conventional double-faced vacuum fluorescent display.
Figure 28:
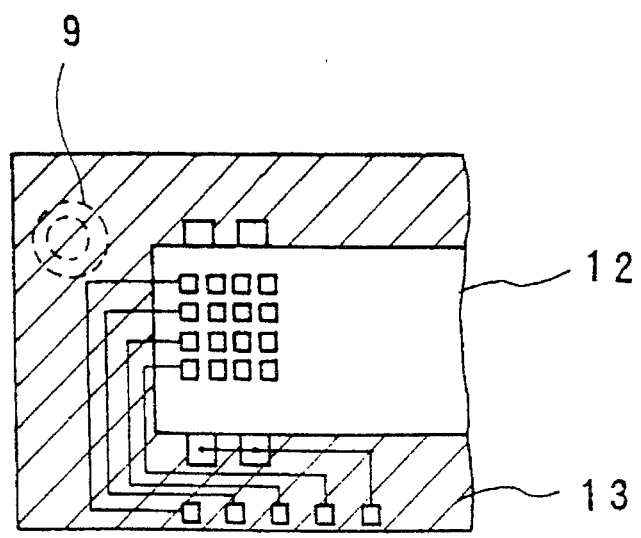
FIG. 28 is a view as seen from the point B in FIG. 27.

A double-faced vacuum fluorescent display 101 according to the first embodiment of this invention will now be described in connection with the manufacturing process with reference to FIGS. 1 through 5. The display 101 comprises an outer casing including a base plate, a front plate facing the base plate, and side member disposed between the base plate and the front plate; a first display portion mounted on an inner surface of the base plate; and a second display portion mounted on an inner surface of the front plate with a gap. The display 101 is an improvement over the prior art of FIG. 26.

(1) Manufacturing Process of the Base Plate (a) Form a wiring pattern, which is composed of a wiring conductor and base-plate side terminal portions, in aluminum thin film on the base plate of glass by photolithography.

(b) Form a black color insulating layer having through-holes on the wiring pattern by printing, and sinter the pattern. This insulating layer serves as a black color background in order to improve contrast of a luminescent display. Fill the through-holes of the insulating layer with a conductive paste, and print anode conductors by a carbon paste on the through-holes of the insulating layer by printing. And sinter the pattern.

(c) Print an enclosing member around the base plate, and sinter it.

(d) Form anodes as the first display portion by printing a fluorescence on the anode conductor and sintering it. The anodes may be formed in a desired pattern, such as bar graph, figure, character, etc.

(e) Place a mesh grid over the anodes with a predetermined distance away therefrom. This mesh grid is connected to grid wires mounted on the base plate by a conductive adhesive.

Figure 1:
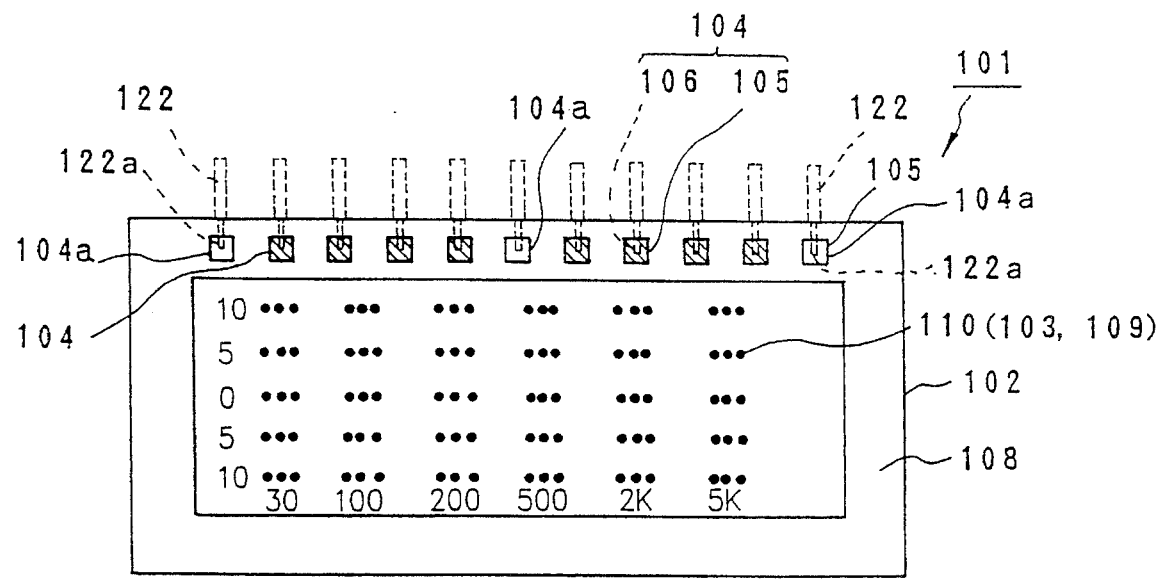
FIG. 1 is a plan view of a front plate of a double-faced vacuum fluorescent display according to a first embodiment of this invention.
Figure 2A:
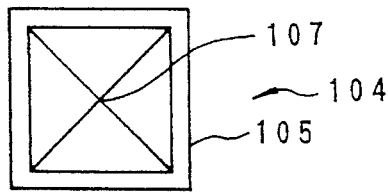
FIGS. 2(a) 2(b) and 2(c) are plan views showing alternative shapes of terminal portions mounted on the front plate of the first embodiment.
Figure 2B:
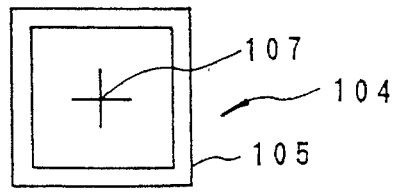
Figure 2C:
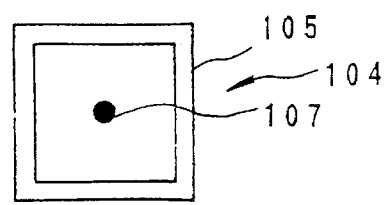

(2) Manufacturing Process of the Front Plate (FIGS. 1 and 2)

(a) Form an aluminum thin film on a front plate 102 of transparent glass, etc, and form a wiring conductor, multi-dot anode conductors 103 and terminal portions 104 by etching and photolithography. The wiring conductor of this embodiment has a width of 50 micro meter or less (preferably 30 micro meter or less). The distance between the adjacent anode conductors 103 is larger than the size of the individual anode conductor 103 so that the anodes of the base plate can be observed beyond the display portion of the front-plate side.

The terminal portions 104, to which external terminals described below are connected, are arranged along one longer side of the front plate 102. The distance between the adjacent terminal portions 104 is equal to the pitch of the external terminals described below. Most of the terminals 104 have generally a rectangular frame 105 and a number of small wires 106 mounted in the frame 105. Some of the terminal portions 104 are composed of the frame 105 and a frame terminal portion 104a corresponding to an external terminal dedicated for positioning, not to be used as an electrode.

If the positioning external terminals cannot be used, it is advisable to form a pattern of plural small wires 106 smaller in size than the end of the external terminal within the frame.

If the pattern is not formed, as shown in FIG. 2, a register mark 107 may be provided in the center of the frame 105 to facilitate positioning of the end of the external terminal.

(b) Print and paint a black color insulating layer 108 on portions except the display portion on the inner surface of the front plate 102.

(c) Print and paint an enclosing member around the inner surface of the front plate 102. Sinter and fix the enclosing member.

(d) Attach a fluorescence 109 to the dotted anode conductor 103 by printing and electrodeposition, to constitute a dotted pattern of anode 110 as a second display portion.

(e) Attach a mesh grid to wiring conductors on the front plate 102 with a conductive adhesive.

Figure 3:
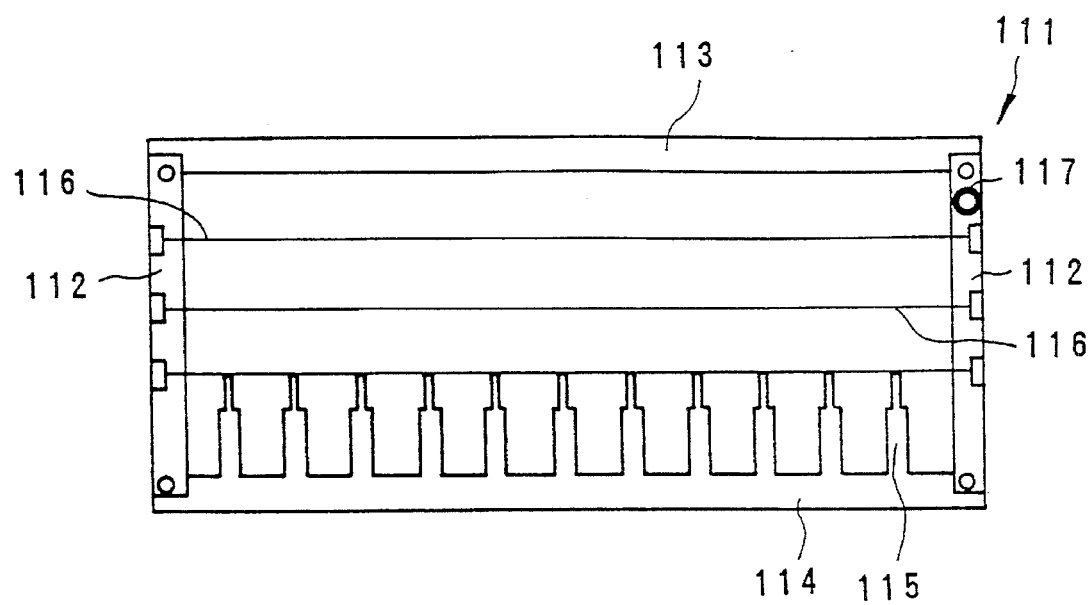
FIG. 3 is a plan view showing a lead frame on the base-plate side according to the first embodiment.

(3) Lead Frame 11 on the Base-Plate Side (FIG. 3)

(a) In the lead frame 111 on the base-plate side, a pair of cathode supports 112, 112 is connected at one ends by a connecting bar 113. A frame member 114 is mounted between the other ends of the cathode supports 112, 112. A number of external terminals 115 connected to the terminal portions on the base-plate side are mounted on the frame 114.

(b) Cathodes 116 in a filament from are welded between the cathode supports 112, 112 to have a predetermined tension. A getter 117 is attached to the cathode support 112.

Figure 4:
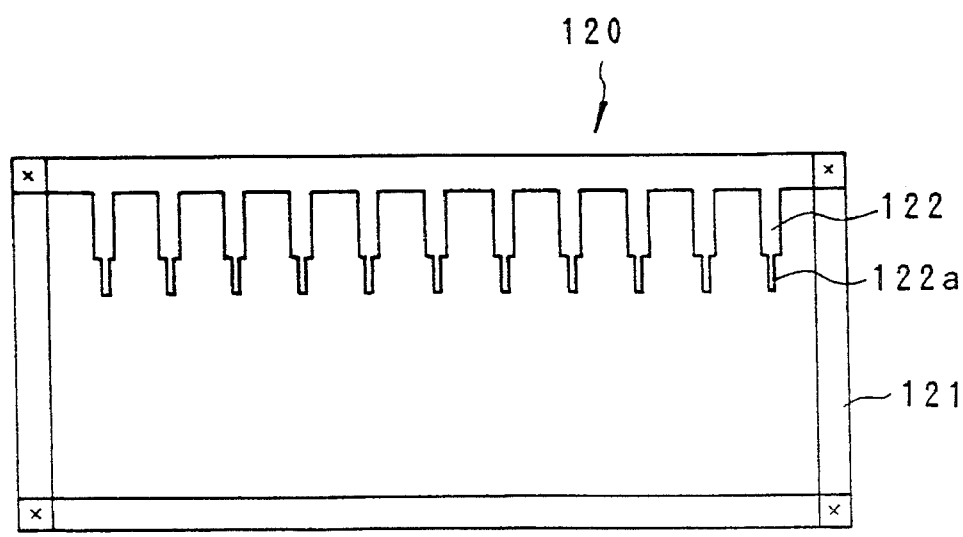
FIG. 4 is a plan view showing a lead frame on the front-place side according to the first embodiment.

(4) Lead Frame 120 on the Front-Plate Side (FIG. 4)

External terminals 122 to be connected to the terminal portions 104, 104a of the front plate 102 are formed on and along one long side of a rectangular frame 121. The pitch of the external terminals 122 is equal to the pitch of the terminal portions 104, 104aof the front plate 102.

Figure 5:
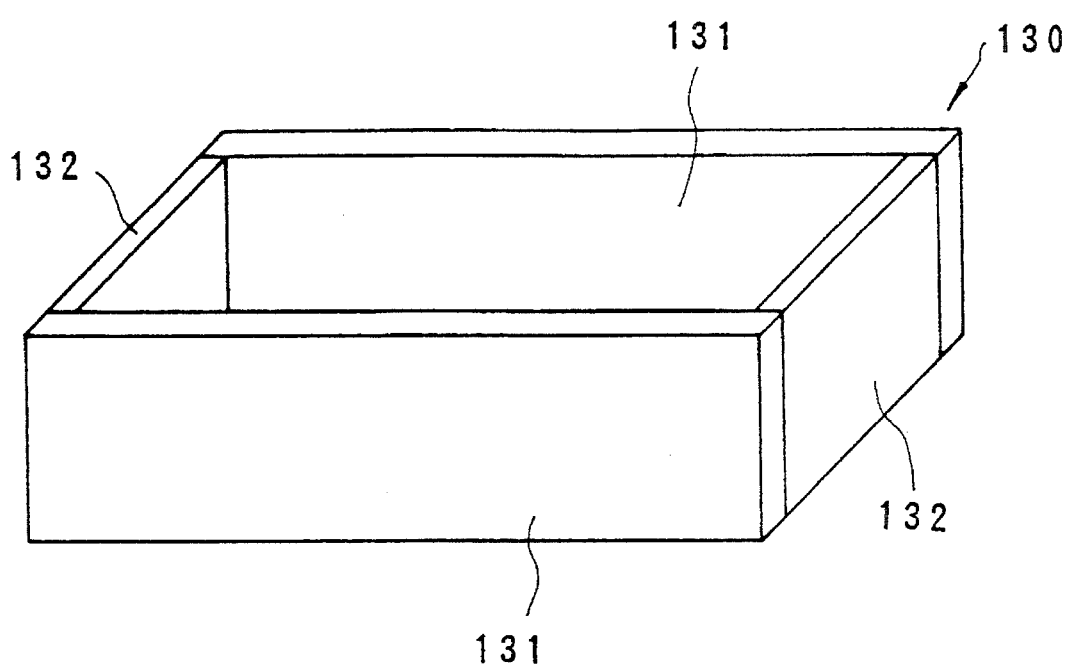
FIG. 5 is a perspective view showing a side portion of the first embodiment.

(5) Side Portion 130 (FIG. 5)

A side portion 130 is constructed by assembling a pair of long side plates 131, 131 of an insulating material such as glass and a pair of short side plates 132, 132 into a rectangular frame shape by using glass adhesive.

(6) Assembling Step (a) Attach the base plate onto a support, and place the lead frame 111 of the base-plate side on the base plate. Position the terminal portions of the base plate in alignment with the inner ends of the external terminals of the lead frame 111.

(b) Place on the lead frame 111 the side portion 130 assembled in the frame.

(c) Place on the side portion 130 the lead frame 120 of the front-plate side, and place the front plate 102 on the lead frame 120 to align the inner ends 122*a* of the external terminal 122 with the transparent terminal portions 104*a* of the front plate. Since the inner ends 122*a* of the external terminals 122 can be observed from the transparent portion in the frame 105 of the terminal portion 104*a* through the front plate 102, easy positioning can be achieved. It is possible to observe the inner ends 122*a* of the external terminals 122 through the other terminal portions 104 having the small wires 106. The outer casing is assembled with the overlapped parts and pressed and fixed by the support. Thus, the inner ends 122*a* of the external terminals 122 are positioned in at least one or several terminal portions 104, 104*a*. Since the external terminals 122 are formed so as to be arranged accurately at a predetermined distance, the inner ends 122*a* of all external terminals 122 are aligned with the respective terminal portions 104, 104*a* of the front plate 102.

(7) Enclosing Step

Heat the assembled outer casing pressed and fixed by the support at about 450° C. in a gas atmosphere, and fuse the enclosing member around the base plate and the front plate airtightly.

(8) Exhaust and Aging Step

Discharge the gas from a non-illustrated exhaust hole (exhaust pipe) of the outer casing, and seal the exhaust pipe when the inside gas is discharged by a vacuum operation. Then this exhaust step is followed by the aging step in which each display portion is illuminated under a constant condition to complete the double-faced vacuum fluorescent display 101.

In the first embodiment of this invention, the terminal portions 104, 104*a* formed on the front plate 102 has the rectangular frame 105. This frame may be circular.

According to this embodiment, in the double-faced vacuum fluorescent display, at least a part of the terminal portions formed on the inner surface of the front plate is transparent so that the inner ends of the external terminals can be observed through the front plate. Therefore, the external terminals are joined with the terminal portions of the front plate reliably, to eliminate poor connections. The assembly is facilitated to improve the working ability.

Further, the base-place side display portion can be observed through the front-plate side dotted display portion. Therefore, within substantially the same display range, the display can be switched between the display by the front-place side display portion and that by the base-plate side display portion. Alternatively, both the front-place side display portion and the base-plate side display portion may be displayed simultaneously.

A double-faced vacuum fluorescent display 201 according to the second embodiment of this invention will now be described. The display device comprises a casing formed of base and outer plates, external terminals extending through the outer casing, and terminal portions mounted on the front plate to which inner ends of the external terminals are connected. At least a part of the terminal portions are connected. The display device is explained in connection with the manufacturing process with reference to FIGS. 6 through 9.

Figure 6:
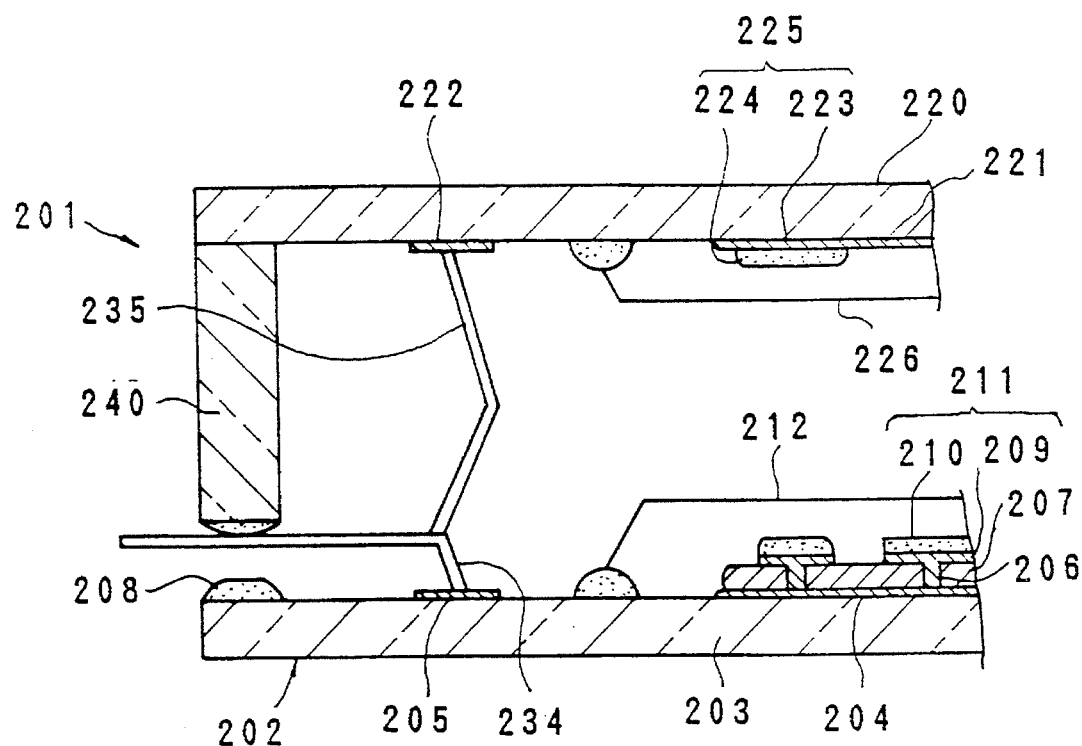
FIG. 6 is an enlarged cross-sectional view showing one manufacturing process according to a second embodiment of this invention.

(1) Manufacturing Process of Anode Base Plate 202 (FIG. 6)

(a) Form a wiring pattern 204 and base-plate side terminals 205 in aluminum thin film on a base plate 203 of glass by photolithography.

(b) Form a black color insulating layer 207 having through-holes 206 on the wiring pattern 204 by printing, and sinter the pattern. This insulating layer 207 serves as a black color background in order to improve the contrast of a luminescent display. Print an enclosing member 208, along with the insulating layer 207, around the base plate 203 and sinter them.

(c) Form anode conductors 209 in a predetermined pattern made of black lead in the through-holes 206 of the insulating layer 207 by printing to connect with the wiring pattern 204 via the through holes 206. Sinter the anode conductors 209 to fix them to the substrate.

(d) Form fluorescent layers 210 on the anode conductors 209 by printing, and sinter the layers and fix them to complete anodes 211.

(e) Place a mesh grid 212 over the anodes 211 with a predetermined distance away from the anodes. This mesh grid 212 is connected to a grid wire mounted on the base plate 203 by a conductive adhesive.

(2) Manufacturing Process of Front Plate (FIG. 6)

(a) Form, on the inner surface of a front plate 220 of transparent glass or the like, a wiring pattern 221, font-plate side terminals 222 and transparent anode conductors 223 by aluminum thin film by photolithography. The wiring pattern 221 has a width of about 30 micro meter, and the anode conductors 223 are of mesh-like so as to have a transparency.

(b) Form fluorescent layers 224 on the anode conductors 223 to constitute anodes 225. For attachment of the fluorescence, printing and electrodeposition may be used.

(c) Place a mesh grid 226 over anodes 225 with a predetermined space between them. Connect the mesh grid 226 to a grid wiring on the front plate 220 by a conductive adhesive.

Figure 7:
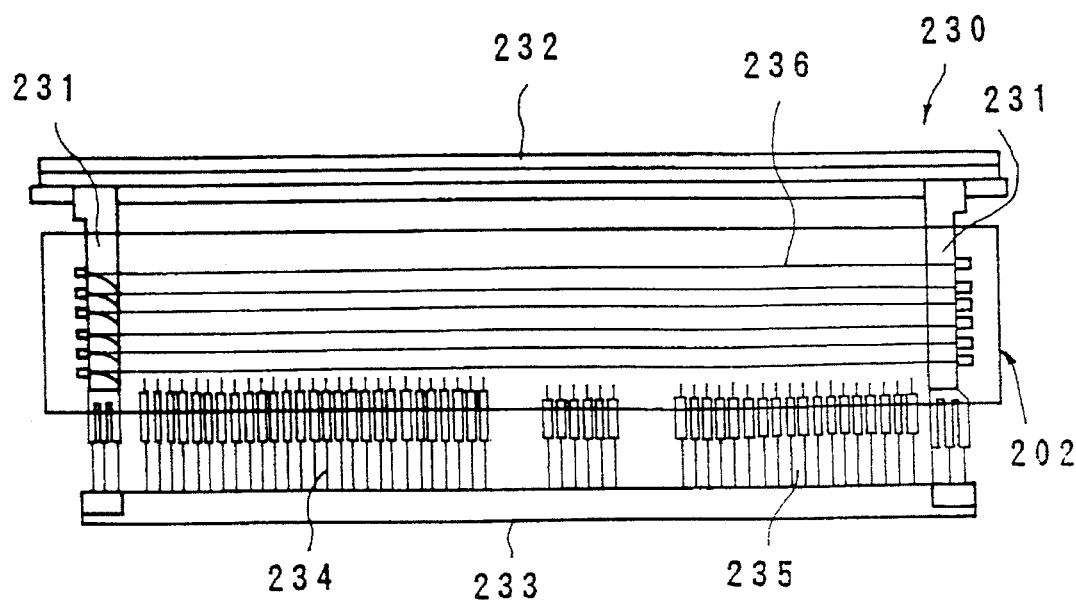
FIG. 7 is a plan view showing a base plate and a spacer frame of one manufacturing process according to the second embodiment.
Figure 8A:
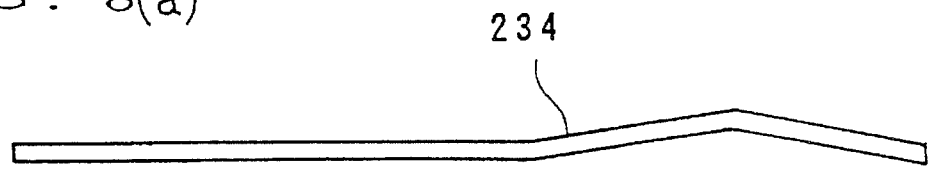
FIGS. 8(a) and 8(b) are views showing shapes of external terminals according to the second embodiment.
Figure 8B:
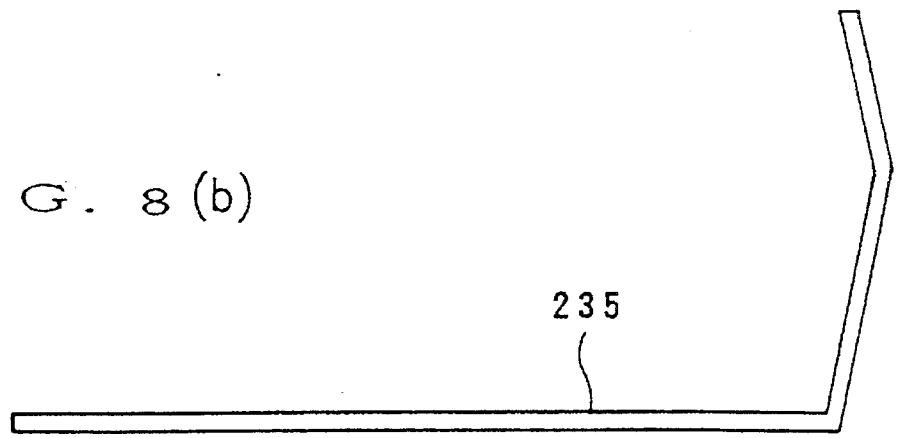

(3) Manufacturing Process of Spacer Frame 230 (FIGS. 7 and (a) A pair of cathode supports 231,231 are connected at one ends by a connecting bar 232 and at the other ends by a frame member 233. A number of external terminals 234, 235 to be connected to the cathode supports 231, the base-plate side terminals 205 and the front-plate side terminals 222 are mounted on the frame member 233. In the external terminals, the external terminals 234 connected to the base-plate terminal 205 are formed in such a manner that their ends are directly downwardly, if the base plate 203 is located on the lower side as shown in FIG. 8(*a*). The external terminals 235 to be connected to the front-plate side terminals are bent in such a manner that their ends are directed upwardly at a substantially right angle as shown in FIG. 8(*b*). Each of the upwardly directed portion and the downwardly directed portion is bent substantially centrally at an obtuse angle.

(b) Cathodes 236 in a filament shape are welded between the cathode supports 231, 231 to have a predetermined tension.

(4) Assembling Step (FIGS. 6 and 7)

Position the spacer frame 230 on the anode base plate 202 so as to bring the downwardly directed ends of the external terminals 234 into contact with the base-plate side terminals 205. The base-plate side terminals 205 may be coated with a conductive adhesive.

Place on the spacer frame 230 a frame-like side plate 240 composed of four glass panels joined edge to edge into a rectangle. On the side plate 240, the front plate 220 is placed in such a position that the ends of the upwardly directed external terminals 235 are brought into contact with the front-plate side terminals 222.

Heat the assembled structure of the anode base plate 202, the side plates 540 and the front plate 220 at about 450° C. in the atmosphere of $CO_2$ gas while the structure is being clamped vertically by using a suitable support, to enclose these members.

With the double-faced vacuum fluorescent display 201 manufactured by the foregoing steps, all of the external terminals 234, 235 extend in the enclosed portion between the side plates 240 and the base plate 203 and are arranged in a row. In the outer casing, since the ends of the external terminals 234, 235 have resiliency to bent into a suitable shape, they stably contact the base-plate side terminals 205 or the front-plate side terminals 222, respectively. In this display, each anode 211, 225 has a display pattern similar to that of the first embodiment, and the luminescent display by the anodes 211, 225 can be observed substantially within the same region through the front plate 220 likewise the first embodiment.

Figure 9:
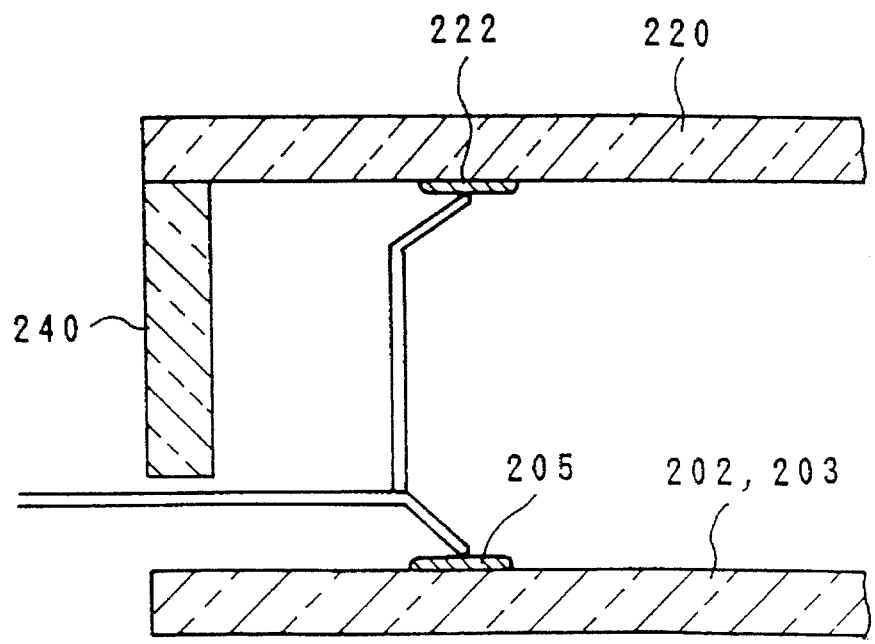
FIG. 9 is a view showing alternative shapes of the external terminals according to the second embodiment.

According to one embodiment of this invention, the spacer frame 230 is sandwiched between the base plate 203 and the side plate 240. Alternatively, the spacer frame 230 may be sandwiched between the front plate 220 and the side plate 240. The interior shape of the outer casing for the external terminals 234, 235 should not be limited to the illustrated example. For example, the outer casing may be bent into an alternative shape as shown in FIG. 9, and the degree of resiliency of the terminals when they contact the terminal portions may be adjusted.

With the double-faced vacuum fluorescent display of this embodiment, since the external terminals project from a single position of the enclosing portion and are arranged in a row, this display is easily installed on a printed circuit board on which a driving circuit is mounted.

Since the position of the external terminals is the same as that of the conventional single-faced vacuum fluorescent display, it is possible to share the manufacturing machine and the inspecting machine with the conventional display in the manufacturing process.

A fluorescent display 301 according to a third embodiment of this invention will now be described with reference to FIGS. 10 through 16.

Figure 10:
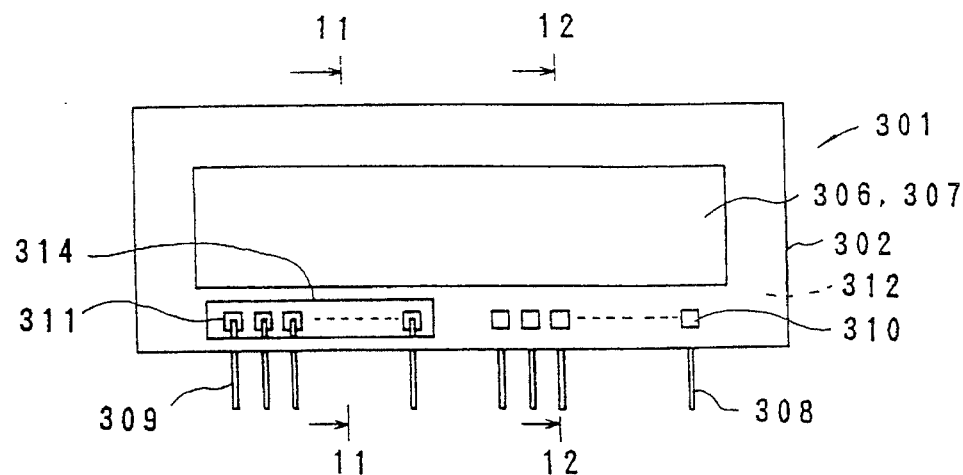
FIG. 10 is a plan view showing a fluorescent display according to a third embodiment of the invention.
Figure 11:
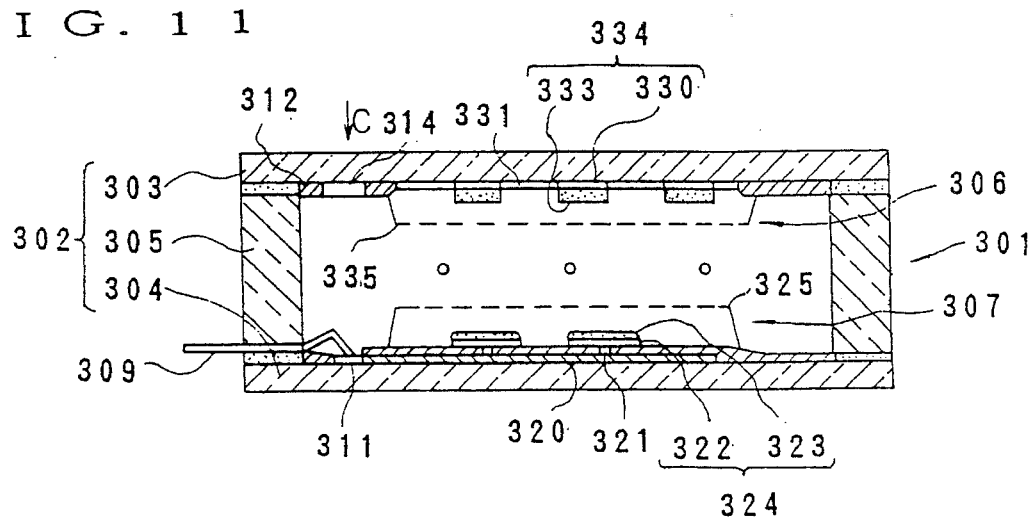
FIG. 11 is an enlarged cross-sectional view taken along line 11—11 of FIG. 10, wherein the view is horizontally oriented.
Figure 12:
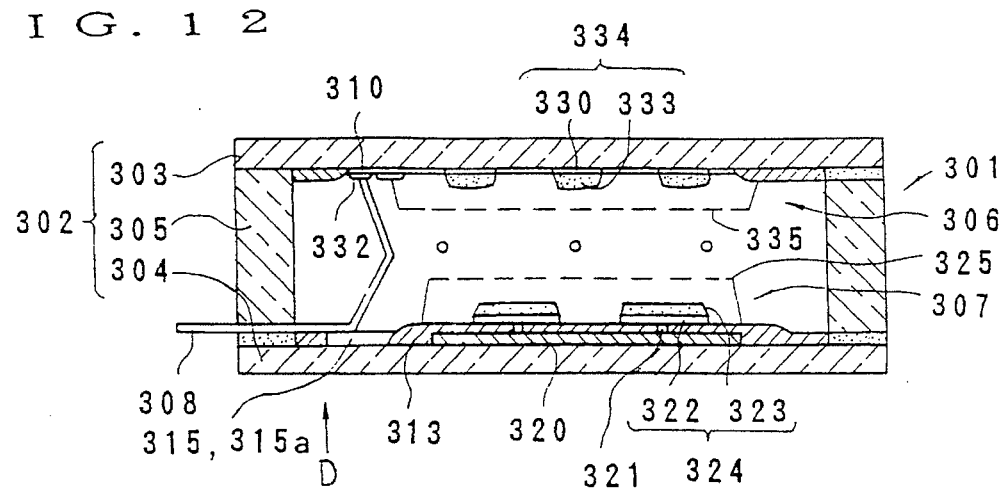
FIG. 12 is an enlarged cross-sectional view taken along line 12—12 of FIG. 10, wherein the view is horizontally oriented.

As shown in FIGS. 10, 11 and 12, the fluorescent display 301 has a box-like outer casing 302 whose interior is highly vacuumed. The outer casing 302 includes side plates 305, a transparent front base plate 303 and a back base plate 304. The outer circumferential portions of the front and back base plates 303, 304 which are facing each other with a predetermined distance therebetween are enclosed via the side plates 305.

As shown in FIGS. 11 and 12, in the fluorescent display 301, two display portions 306, 307 are mounted on the front and back base plates 303, 304, respectively. The display portions 306, 307 can be observed in a mutually overlapping posture from the front-plate side. As shown in FIG. 10, on one long side of the outer casing 302, external lead wires 308 to be connected to the front-base-plate side display portion and external lead wires 309 to be connected to the back-base-plate side display portion 307 are arranged with a predetermined distance away from each other. As shown in FIGS. 11 and 12, the individual external lead wires 308, 309 extend out from the enclosed portion of the side plate 305 and the back base plate 304.

Figure 13:
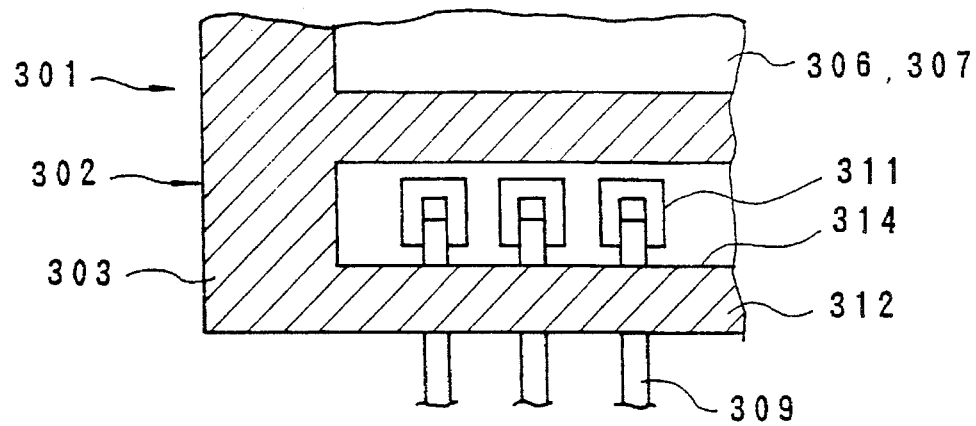
FIG. 13 is an enlarged view showing a portion indicated by C in FIG. 11.

As shown in FIG. 11, the back-base-plate side external lead wires 309 contact the terminals leading to the display portion 307 of the back base plate 304. Around the display portion 306 of the front base plate 303, a rectangular shield film 312 is formed for shielding light or the like. The shield film 312 has, at a portion corresponding to the terminals 311 of the back base plate 304, an elongated through-hole 314 larger than the terminals 311 as shown in FIG. 13. Therefore, the individual external lead wires 309 touching the respective terminals 311 can be observed from the front-base-plate side through-hole 314.

As shown in FIG. 12, the front-base-plate side external lead wires 308 have inner ends, which are situated in the outer casing 302 and are curved upwardly to touch the terminals 310 leading to the display portion 306 of the front base plate 303. A shield film is provided under the display portion 307 of the back base plate 304 for shielding light or the like. The shield film 313 has, at portions corresponding to the terminals 310 of the front base plate 303, through-hole portions 315. These through-hole portions 315 are composed of a number of through-holes 315a arranged at portions corresponding to the respective terminals 310 of the front base plate 303, each through-hole 315a having a width slightly larger than the external lead wire 308. Therefore, the each external lead wire 308 touching the respective terminal 310 of the front base plate 303 can be observed from the back-base-plate side through-hole 315a.

According to the fluorescent display 301 in which luminescent display takes place on both the front base plate 303 and the back base plate 304, the substantially entire surface of the back base plate 304 and the outer circumferential surface of the front base plate 303 are covered by the shield films 313, 312. But since the individual through-holes 314, 315 are formed in the respective shield films 312, 313 of the front and back base plates 303, 304 at suitable positions, the state of connection between the external lead wires 308, 309 and the terminals 310, 311 in the outer casing 302 can be observed even while the outer casing 302 is being assembled.

The structure of the fluorescent display 301 will now be described in detail in connection with the manufacturing process with reference to FIGS. 10 through 15.

(1) Back Base Plate 304

(a) Form, on the inner surface of the back base plate 304 made of an insulating material, such as glass or the like, an wiring conductor 320, terminals 311 on the outer terminal portion of the wiring conductor 320, and a register mark for the frame to be positioned on the back base plate 304 by an aluminum thin film, as shown in FIG. 11.

Figure 14:
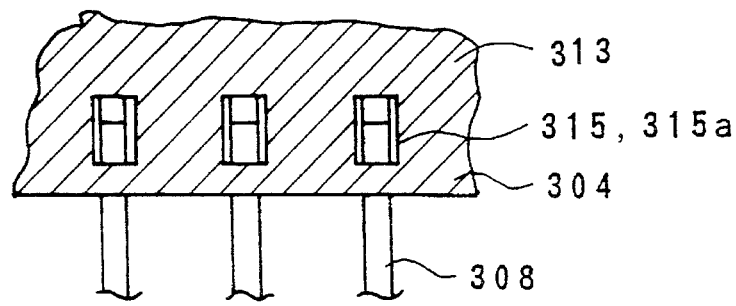
FIG. 14 is an enlarged view showing a portion indicated by D in FIG.12.

(2) Form, on the entire surface of the back base plate 304 except the terminals 311, a back color shield film 313 having insulating and light shielding characteristics, as shown in FIGS. 11, 12. The shield film 313 has through-holes 321 at positions where the display portion is formed. The shield film 313 has also a through-hole portion 315, i.e. as shown in FIG. 14, a number of rectangular through-holes 315a formed at positions corresponding to the respective terminals 310 of the front base plate 303, at the same pitch as that of the terminals 310.

The reason why the through-holes 315a are formed is that the external lead wires 308 can be observed from the outside of the outer casing 302 to facilitate the positioning. Accordingly, each through hole 315a has a width slightly larger than that of the end of the external lead wire 308, i.e., slightly smaller than the width of the terminal 310 of the front base plate 303.

Figure 15:
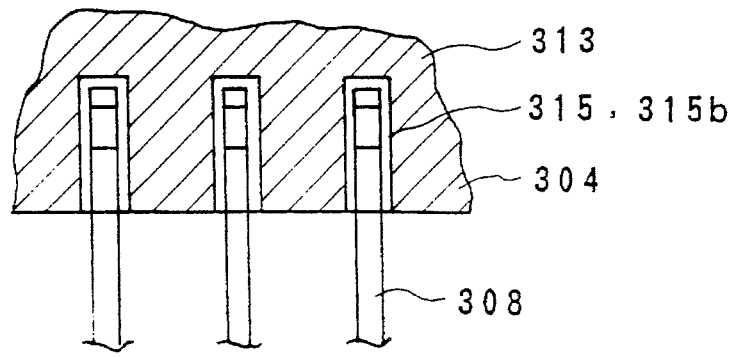
FIG. 15 is a view showing a modified form of the portion indicated in FIG. 14 in the third embodiment.

Assuming that, as shown in FIG. 15, the width of the through-holes 315a and the pitch of arrangement of the through-holes 315a in the direction of the arrangement of the external lead wires 308 are unchanged, and the size of the through-holes 315b in the direction perpendicular to this direction is increased, the external lead wire 308 can be seen more readily to facilitate positioning.

(c) Pack the through-holes 321 of the shield film 313 with the conductive paste as shown in FIG. 12. Form, on the shield film 313 where through-holes 321 are formed, anode conductors 322 made of a conductive material such as carbon paste. Form fluorescent layers 323 on the anode conductors 322 to complete anodes 324. This anode 324 has a predetermined shape and is situated at a predetermined position to constitute the back-base-plate side display portion 307.

(2) Front Base Plate 303

(a) Form, on the inner surface of the front base plate 303 made of an insulative and transparent material such as glass, anode conductors 330, wiring conductors 331 leading from the anode conductors 330, and terminals 310 on the outer terminal portions of the wiring conductors 331, by an aluminum thin film or an indium-tin oxide film, as shown in FIG. 12. In the conductors and terminals, at least the anode conductors 330 and the wiring conductors 331 must be arranged in such a pattern that the back-plate side display portion 307 can be observed through the anode conductors 330 and the wiring conductors 331.

(b) Cover the inner circumferential surface of the front base plate 303 except the terminals 310, with the transparent and conductive shield film 312, as shown in FIGS. 11 and 12. The shield film 312 has a frame-like shape along the peripheral edge of the front base plate 303 and divides the front-base-plate side and back-base-plate side display portions 306, 307 into rectangle shapes.

The shield film 312 has through-hole portion at positions corresponding to the back-base-plate side terminals 311. The reason why the through-hole portion 314 is provided is that it can be observed from the outside of the outer casing 302 that the back-base-plate side external lead wires 309 correctly touch the back-base-plate side terminals 311.

The through-hole portion 314, as shown in FIGS. 10 and 13, is an elongated hole continuous in the direction of arrangement of the terminals 311 of the back base plate 304, and its size and shape are determined in such a manner that the terminals 311 of the back base plate 304 can be observed. In this embodiment, the front-base-plate side through-hole portion 314 is elongated. Alternatively, the through-hole portion may be composed of a number of through-holes 315a, 315b corresponding to the respective terminals like the back-base-plate side through-hole portions 315.

(c) After the shield film 312 has been formed, as shown in FIG. 12, a conductive adhesive 332 of, for example, a silver paste is provided over the terminals 310 of the front base plate 303.

(d) Form fluorescent layers 333 on the anode conductors 330 to complete anodes 334. This anode 334 has a predetermined shape and is situated at a predetermined position, thus constituting the front-base-plate side display portion 306.

(3) Assembling of Outer Casing 302

(a) Attach grids 325, 335 at respective predetermined positions on the front base plate 303 and the back base plate 304. Though the details of the attaching structure is not shown in the drawings, the grids 325, 335 are connected to the respective terminals 311, 310 via a conductive paste formed on the through-holes of the shield films 313, 312.

(b) Firstly place a lead frame on the back base plate 304 and adjust both in registry with each other. The lead frame includes the external leads 308, 309 and non-illustrated cathode supports, which are united by a frame member. The lead frame is made of 426 alloy having a coefficient of thermal expansion similar to that of glass constituting the outer casing 302 of this fluorescent display 301.

The lead frame is precisely positioned with respect to the back base plate 304 by using the register mark formed on the back base plate 304. At that time, as shown in FIGS. 12 and 14, the through-hole portion 315 of the back-base plate 304 is positioned with respect to the external lead 308 connected to the front base plate 303. As shown FIGS. 11 and 13, the individual external lead wires 309 to be connected to the back base plate 304 are brought into contact with the respective terminals 311 of the back base plate 304.

The side plates 305 assembled in the frame are placed on the back base plate 304. The front base plate 303 is placed on the side plates 305. The back-base-plate side external lead wires 309 can be confirmed from the through-hole portion 314 of the front base plate 303 such that the external lead wires 309 are surely touching the back-base-plate side terminals 311.

Using temporarily fixing means such as a clipper, the assembled outer casing 302 is temporarily fixed. It is confirmed from the through-hole portions 315, 314 whether or not the external leads 308, 309 are in alignment with the terminals 310, 311. In other words, it is confirmed from the through-hole portion 314 of the front base plate 303 that the terminals of the back base plate 304 are positioned with respect to the external lead wires 309 to be connected to the back-base-plate side display portion 307. Further, it is confirmed from the through-hole portions 315 of the back base plate 304 that the terminals 310 of the front base plate 303 are positioned with respect to the external lead wires 308 to be connected to the front-base-plate side display portion 306. Any error in positioning is corrected.

(c) Place the temporarily fixed outer casing 302 into an incinerator, and sinter it.

Then, a gas inside the outer casing 302 is discharged to make the interior of the casing highly vacuum, and the exhaust holes are sealed. Form a getter film inside the outer casing 302 to increase the degree of vacuum of the outer casing 302.

In one of the foregoing embodiments, a single fluorescent display 301 has the display portions 306, 307 on the front and back sides, respectively so that the connections between the terminals 310, 311 of the respective displays 306, 307 and the external lead wires 308, 309 can be observed through the through-hole portions 315, 314 of the shield film 313, 312 formed on the opposite side plates. The pattern of the opposite display portions of this embodiment may be identical with that of the first embodiment. However, the concept of this invention that the shield films formed on the base plates have through-hole portions through which the connection between the external lead wires and the terminals inside the outer casing 302 can be observed, may be applied to a single-faced fluorescent display having the display on only one base plate.

For example, this invention may be applied also to a fluorescent display in which the display on the back base plate is to be observed through the front base plate. Further, the invention may be applied also to a fluorescent display in which the display portion formed on the inner surface of the front base plate is to be observed through the front base plate which is transparent.

Figure 16:
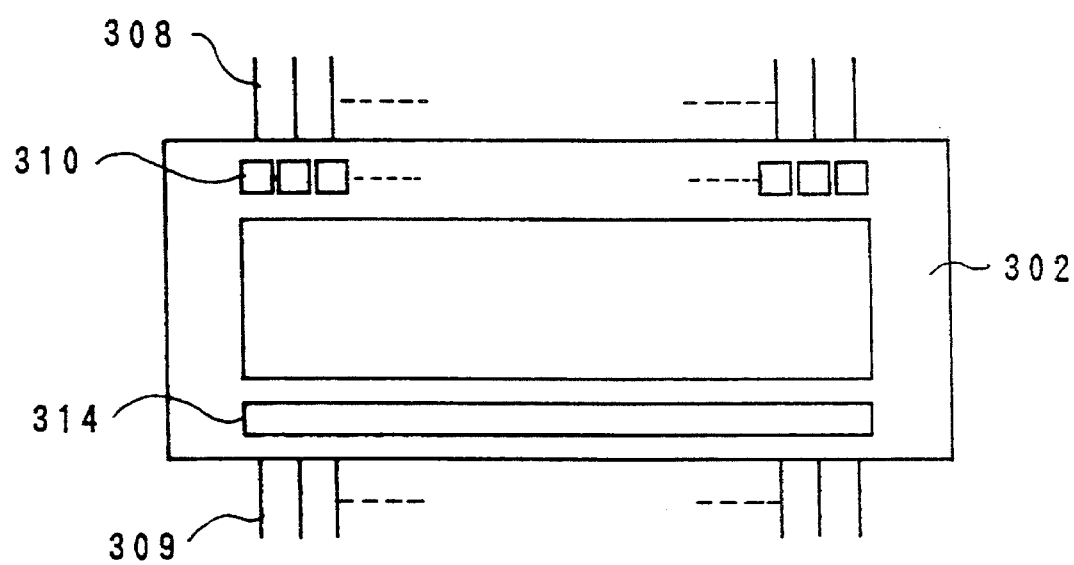
FIG. 16 is a plan view showing another modified form of the third embodiment.

In the third embodiment, the external lead wires 308 to be connected to the front-base-plate side display portion 306, and the external lead wires 309 to be connected to the back-base-plate side display portion 307 are arranged along one long side of the outer casing 302. However, as shown in FIG. 16, these two kinds of external lead wires 308, 309 may be led separately from the two opposite long sides of the outer casing 302. With this arrangement, it is possible to secure adequate space for external lead wires if the outer casing is small.

According to the fluorescent display of this embodiment, the shield film of the base plate of the outer casing has the through-holes so that the positioning between the terminals and external lead wires on the opposite side base plates can be observed from outside. Accordingly, when assembling the outer casing of the fluorescent display, it is possible to position the external lead wires and the terminals easily with respect to one another so that it would become easier to operate and poor contacts of the external leads with the terminals would hardly occur, thus improving the rate of yielding during assembling.

A fourth embodiment of this invention will now be described with reference to FIGS. 17 through 22.

Figure 17A:
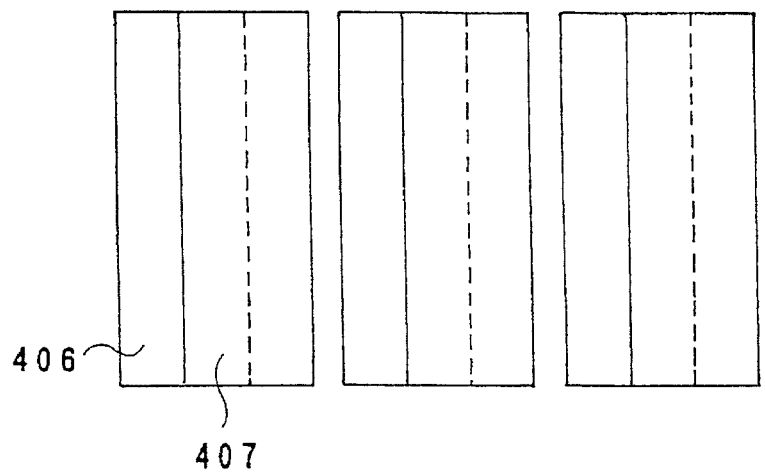
FIGS. 17(a) and 17(b) are a schematic plan view and a schematic cross-sectional view showing a fourth embodiment of the invention.
Figure 17B:
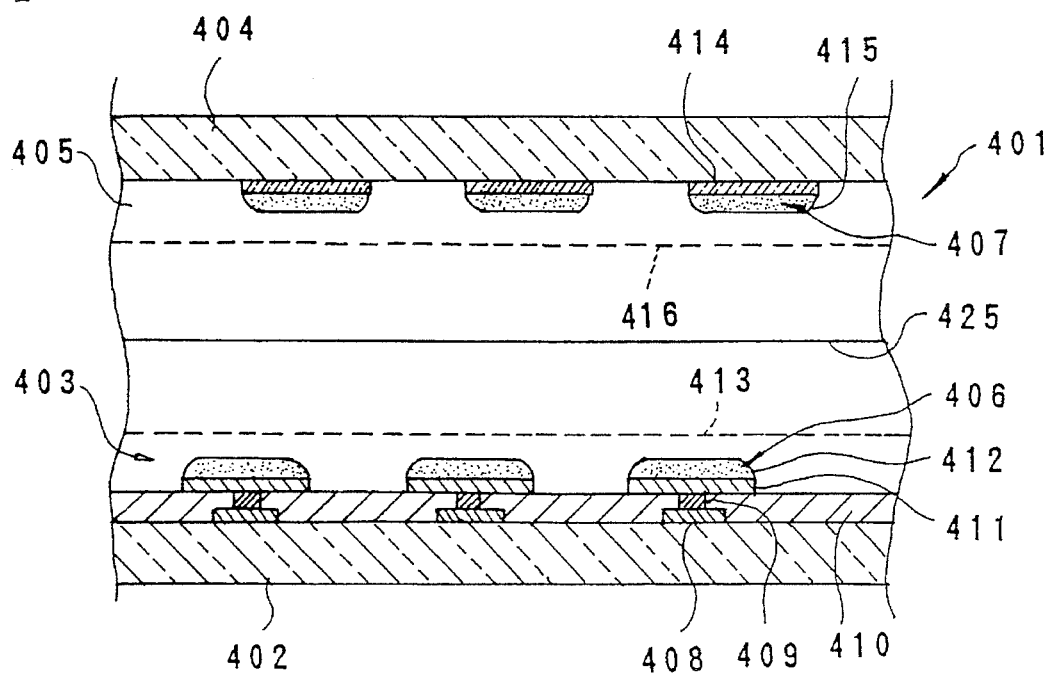

In a double-faced vacuum fluorescent display 401 of FIG. 17, the first display portion 403 formed on the base plate 402 and the second display portion 405 formed on the front plate 404 have the same pattern. Specifically, the display portions 403, 405 have a number of rectangular first and second anode segments 406, 407 arranged in a row at a predetermined distance away from each other to display the same pattern of a bar graph. The two display portions 403, 405 are arranged in a staggered manner by a half of the width of the first and second anode segments 406, 407 in the longitudinal direction of the bars. Therefore, when observed from the front-base-plate side, the second anode segments 407 of the second display portion 405 on the side of the observer partly overlaps the first anode segments 406 of the first display portion 403 on the side away from the observer.

The structure of the double-faced vacuum fluorescent display 401 will now be described in connection with the manufacturing process with reference to FIG. 17.

(1) Manufacturing Process of Base Plate 402

(a) Form the wiring pattern 408 and the base-plate side terminals on the base plate 402 of glass by an aluminum thin film by, for example, photoetching.

(b) Form on the wiring pattern 408 a black color insulating layer 410 having through-holes 409. This insulating layer 410 serves as a black background for improving the contrast of a luminescent display. Along with the forming of the insulating layer 410, print an enclosing member around the base plate 402, and sinter them to fix to the foundation.

(c) Form on each through-hole 409 of the insulating layer 41 a predetermined pattern of anode conductor 411 by printing so that this anode pattern is connected with the wiring pattern 408 via the through hole 409. Sinter also this anode conductor 411 to fix to the foundation.

(d) Form on the anode conductors 411 the fluorescent layers 412 by printing. Then, sinter and fix the resulting layer to form a number of first anode segments 406. As a result, the first display portion 403 forms the bar display.

(e) Arrange mesh grids 413 over the respective first anode segments 406 at a predetermined distance away from each other. The mesh grids 413 are connected to the grid wiring, which is formed on the base plate 402, by a conductive adhesive.

(2) Manufacturing Process of Front Plate 404

(a) Form, on the inner surface of the front plate 404 of transparent glass or the like, the wiring pattern, the front-base-plate side terminals, and the anode conductors 414 by an aluminum thin film by photoetching. The wiring pattern has a width of about 30 micro meter, and the anode conductor 414 has a mesh structure and hence transparency. Alternatively, the wiring pattern and the anode conductor 414 may be formed of a transparent conductive film of, for example, indium-tin oxide.

(b) Form fluorescent layers 415 on the anode conductors 414 to form a number of second anode segments 407 which constitute the second display portion 405 for a bar display. For attaching the fluorescence, printing or electrodeposition may be used.

(c) Arrange mesh grids 416 over the respective second anode segments 407 at a predetermined distance away from each other. The mesh grids 416 are connected to the grid wiring, which is formed on the base plate 404, by a conductive adhesive.

Assemble the base plate 402 and the front plate 404 into a box shape by using non-illustrated side plates, external terminals and a non-illustrated spacer frame equipped with filaments. Heat this assembled structure at about 450° C. while the structure is vertically clamped from opposite sides by using a suitable support to enclose the assembled members to complete the outer casing.

In this double-faced vacuum fluorescent display 401, the material of the fluorescent layer 412 of the first display portion 403 is exemplified by ZnCdZ:Ag, Cl luminescent in red, while the material of the fluorescent layer 415 of the second display portion 405 is ZnO:Zn luminescent in green. Therefore according to the double-faced vacuum fluorescent display of this embodiment, it is possible to display the same bar graph switchably in two colors, red and green, and it is possible to make the two display portions 403,405 luminescent simultaneously to display a mixed color bar graph. Further, the mesh grids 413 prevent sulfide gas, which develops as a result of decomposition of ZnCdS:Ag, Cl fluorescence, from scattering around, so that the ZnO:Zn fluorescence of the second display portion 405 on the opposite side is free from contamination.

An alternative double-faced vacuum fluorescent display 421 according to the fourth embodiment will now be described with reference to FIG. 18.

In this embodiment, the first display portion 423 of the base plate 422 and the second display portion 425 of the front plate 424 have a common pattern for bar graph displays, in which a number of rectangular first and second anode segments 426, 427 are arranged in a row at a predetermined distance away from each other. However, unlike the first embodiment, the individual anode segments 426, 427 of the two display portions 423, 425 are different in width in the longitudinal direction of the bars. Specifically, the first anode segments 426 of the lower or first display 423 with ZnO:Zn luminescent in green has a width larger than that of the second anode segment 427 of the upper or second display 425 with ZnCdS:Ag, Cl luminescent in red, but they have substantially identical shapes. The identical anode segments 427 of the second display portion 425 are designed so as to overlap in the center of the first anode segments 426 of the first display portion 423. In this embodiment, the structure, manufacturing process and operation of the display portions 423, 425 are identical with those of the embodiment of FIG. 18, so their description is omitted.

Figure 19A:
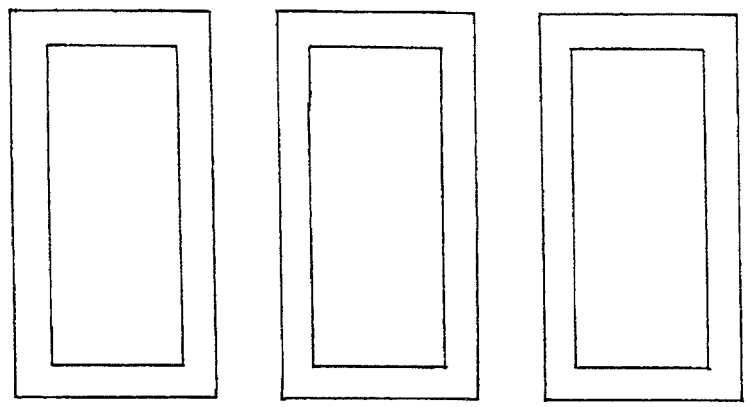
FIGS. 19(a) and 19(b) are a schematic plan view and a schematic cross-sectional view showing another modified form of the fourth embodiment.
Figure 19B:
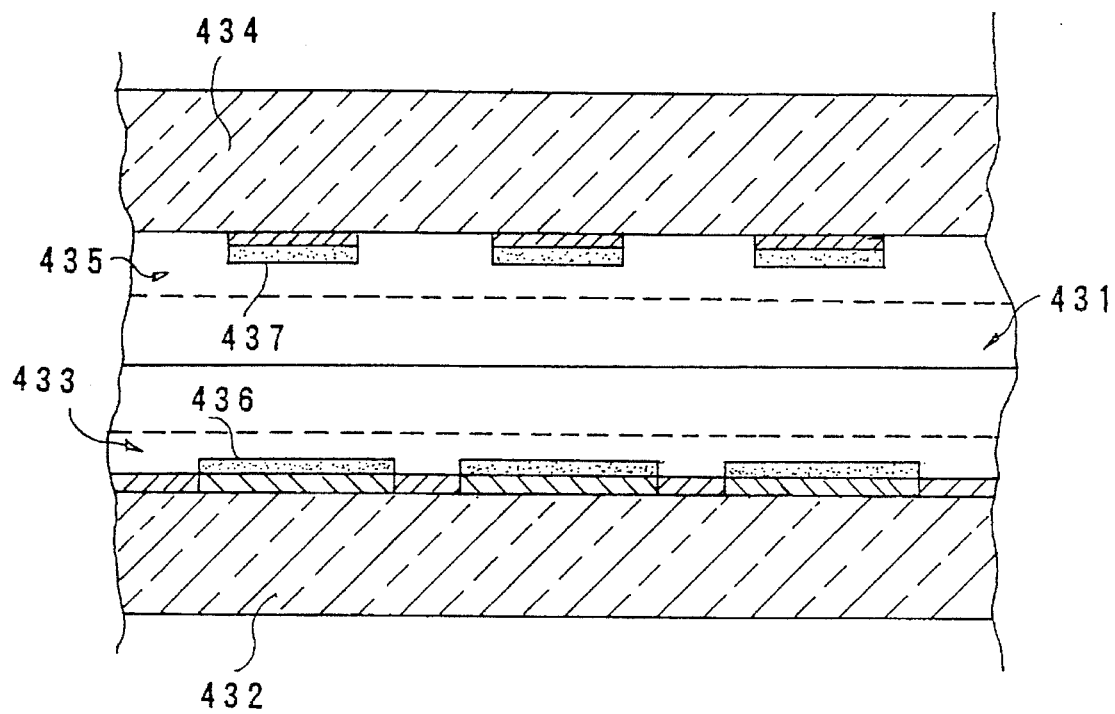

Another alternative double-faced vacuum fluorescent display 431 according to the fourth embodiment will now be described with reference to FIG. 19.

In this embodiment, the first display portion of the base plate 432 and the second display portion 435 of the front plate 434 have a common pattern for bar graph displays in which a number of rectangular first and second anode segments 436, 437 are arranged in a row at a predetermined distance away from each other. However, unlike the foregoing two examples of the fourth embodiment, the anode segments 436 of the first display portion 433 and the anode segments 437 of the second display portion 435 are analogous in shape to one another. The first anode segments 436 are larger than the second anode segments 437. The individual second anode segments 437 of the second display portion 435 are arranged so as to position centrally of the respective first anode segments 436 of the first display portion 433. The remaining construction and operation, etc. are identical with those of the foregoing examples.

Figures 20A, 20B:
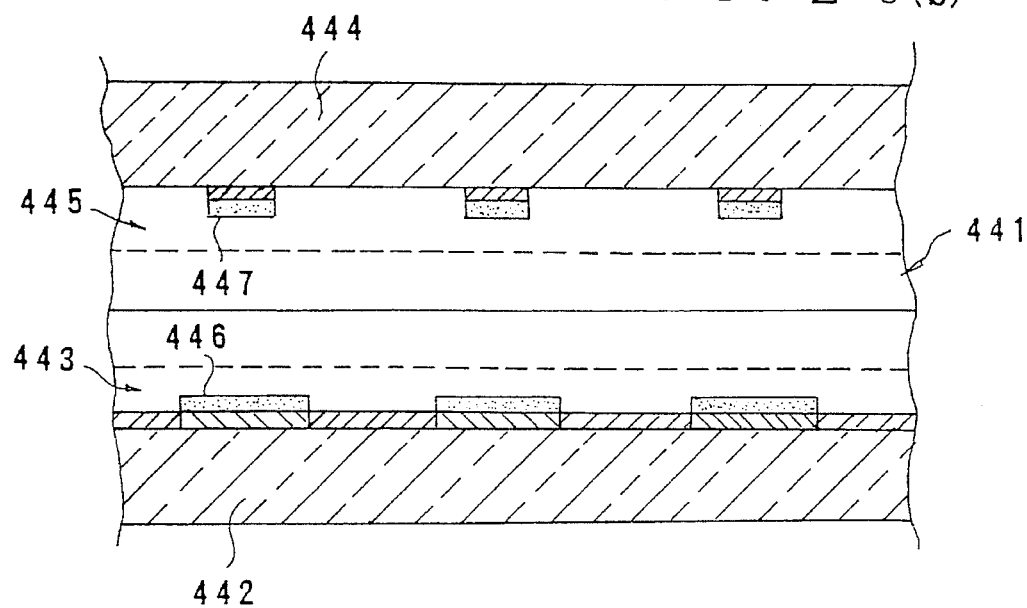
FIGS. 20(a) and 20(b) are a schematic plan view and a schematic cross-sectional view showing still another modified form of the fourth embodiment.

Still another alternative double-faced vacuum fluorescent display 441 according to the fourth embodiment will now be described with reference to FIG. 20.

In this embodiment, the first display 443 of the base plate 442 and the second display portion 445 of the front plate 444 have a common pattern for graphic displays in which a number of square first and second anode segments 446, 447 are arranged in rows and columns at a predetermined distance away from each other. The first anode segments 446 of the first display portion 443 and the second anode segments 447 of the second display portion 445 are analogous in shapes to one another. The first anode segments 447 of the first display portion 443 are larger than the second anode segments 447 of the second display 445. The second anode segments of the second display portion 445 are arranged so as to position centrally of the first anode segments 446 of the first display part. The remaining construction, operation, etc. are identical with the foregoing examples, except that graphic display can be made in three or more colors by two kinds of fluorescence.

Figure 21:
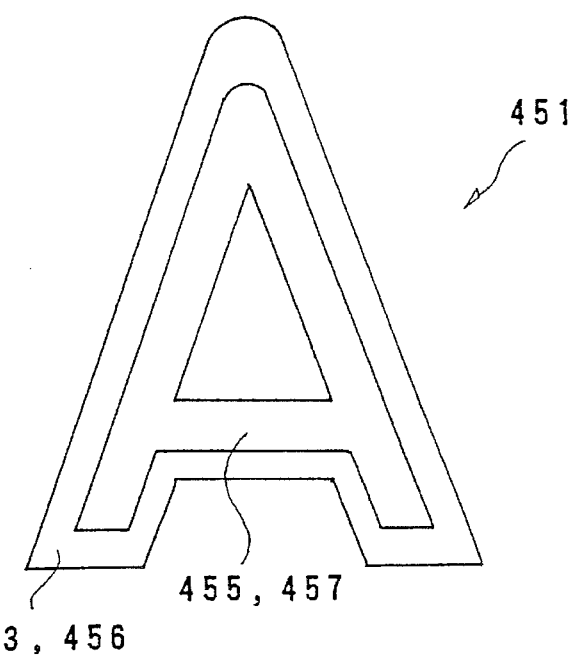
FIG. 21 is a schematic plan view showing a pattern of the fourth embodiment.

Another alternative double-faced vacuum fluorescent display according to the fourth embodiment will now be described with reference to FIG. 21.

In this embodiment, the base-plate side first display portion 453 and the front-plate side second display portion have a common "A" shape in first and second anode segments 456, 457. The first anode segments 456 of the lower or first display portion 453 are larger than the second anode segments 457 of the upper or second display portion 455. The two display portions 453, 455 are arranged so as to overlap with each other in such a manner that the first display portion 453 is exposed around the outer periphery of the second display portion 455. The construction, operation, etc. are identical with those of the foregoing embodiments, except that a character display in three or more colors is possible by two kinds of fluorescence.

Figure 22:
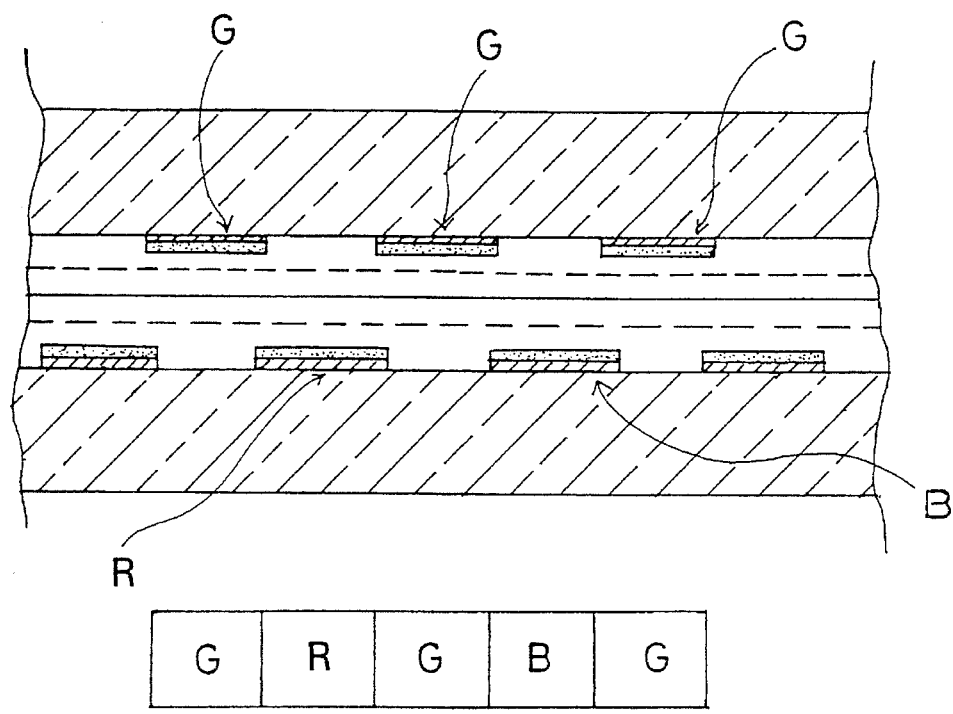
FIG. 22 is a schematic plan view and a schematic cross-sectional view showing still another modified form of the fourth embodiment.

FIG. 22 shows a still another alternative double-faced vacuum fluorescent display according to the fourth embodiment. In the first display portion on the base plate side, the first anode segments whose luminescent colors are red (R) and blue (B) are arranged alternately at a predetermined distance away from each other. In the second display portion on the front plate side, the second anode segments whose luminescent color is green (G) are positioned and arranged in such a manner that parts of the second anode segments on the opposite side overlap the first anode segments. According to this embodiment, fluorescence for three kinds of luminescent colors are arranged continuously at a predetermined pattern with no gap as shown in FIG. 22. The remaining construction, operation, etc. are substantially identical with those of the foregoing examples.

The results of this embodiment are as follows:

(1) It is possible to display the same pattern in the same position switchably in different luminescent colors.

(2) Since the anode segments of the two display portions are arranged so as to partially overlap one another substantially at the same positions, it is possible to mix different luminescent colors of the individual display portions readily to show a color display in colors more than the kinds of fluorescence to be used.

(3) Since the anode segments of the two display portions are arranged so as to overlap partly one another at substantially the same positions, it is possible to mix different luminescent colors of the display portions to show a display in colors more than the number of kinds of fluorescence to be used.

A fifth embodiment of this invention will now be described with reference to FIGS. 23 and 24.

A double-faced vacuum fluorescent display 501 of this embodiment has a box-like outer casing 505 which comprises front and back base plates 502, 503 arranged in parallel with a predetermined distance away from each other, and frame-like side plates 504 between the respective outer circumferential portions of the two base plates 502, 503.

Although details are not shown in the drawings, display portions 511 are mounted on the respective inner sides of the front base plate 502 and the back base plate 503 so that the two display portions can be observed through the front base plate 502. The construction of the display portions is identical with those of the first embodiment.

Figure 24:
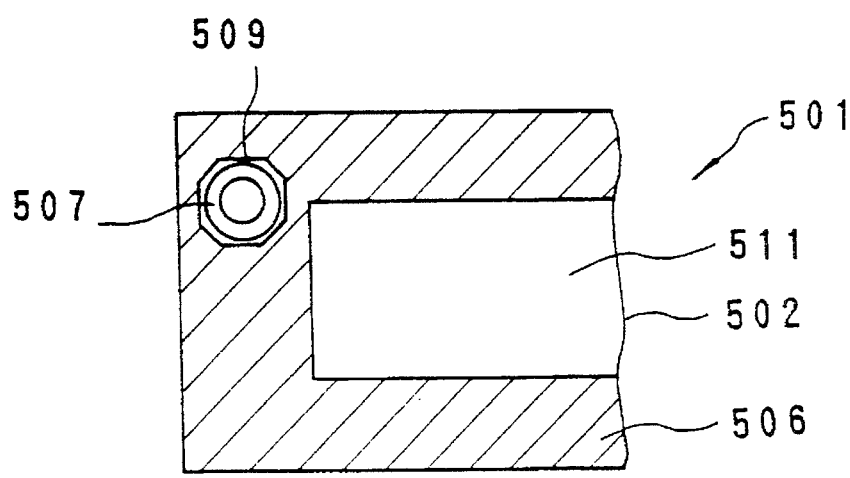
FIG. 24 is a view as seen from the point A in FIG. 23, wherein a pattern of the display portion is omitted.
Figure 25:
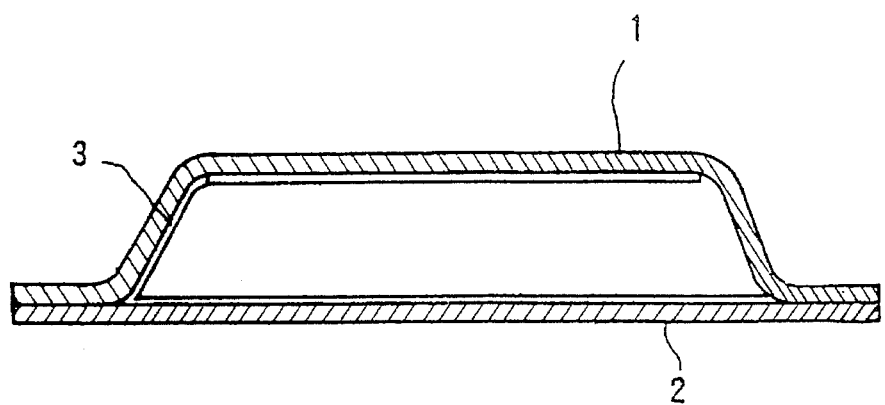
FIG. 25 is a cross-sectional view of a conventional double-faced vacuum fluorescent display.

On the inner surface of the front base plate 502, a light-shield insulating film 506 is attached except the display portion as shown in FIG. 24. This insulating film 506 keeps insulation between the central terminal portion of the grid and the wiring pattern to protect the wiring pattern, and also serves to shield light from the outside. Also on the back base plate 503, a light-shield insulating film 506 is attached to the substantially entire inner surface.

Figure 23:
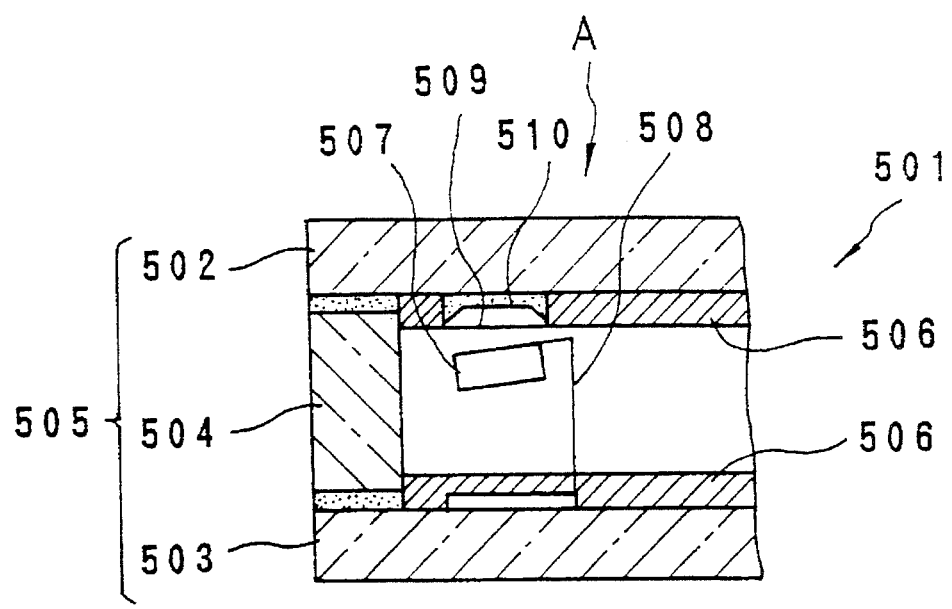
FIG. 23 is a fragmentary cross-sectional view showing a fifth embodiment of the invention.

As shown in FIGS. 23, 24, in the outer casing of this double-faced vacuum fluorescent display 501, a getter 507 is mounted in order to improve the degree of vacuum in the outer casing 505. This getter 507 is mounted upright on the back base plate 503 via a support member 508 to face the inner surface of the outer periphery portion of the front plate 502. On a part of the front plate 502 covered by the insulating film 506 facing the getter 507, a getter-film-covered portion 509 free of the insulating film 506 is attached. In this embodiment, the getter 507 is of a substantially circular disc, and the getter-film-covered portion 509 facing this disc is substantially identical in diameter and size with the getter 507.

Further, as shown in FIG. 23, a getter film 510 is formed on the getter-film-covered portion 509. For forming the getter film 510, an electrode of a high-frequency induction heater must be brought close to the getter 507 from the outside of the outer casing 505. In this embodiment, since the getter 507 can be directly observed from the getter-film-covered portion 509 through the front base plate 502 of the outer casing 505, it is possible to form the getter film 510 by applying high frequency waves accurately only to the getter 507.

Since the getter film 510 is formed on the getter-film-covered portion 509 free of the insulating film 506, it can be seen from the outside of the outer casing 505. It is therefore possible to confirm directly by naked eye whether or not the getter film 510 has been formed correctly.

A part of the manufacturing process of the double-faced vacuum fluorescent display 501 of this embodiment will now be described in brief.

(a) Attach aluminum thin films on the inner surfaces of the front and back base plates 502, 503 by sputtering. The wiring conductor and the transparent anode conductor are formed by photolithography.

(b) Form the insulating films 506 at predetermined portions of the inner surfaces of the front and back base plates 502, 503 so that only the display portions of the two base plates 502, 503 can be observed from the front-base-plate side. The insulating layer 506 at a portion facing the getter 507 is taken out to provide the getter-film-covered portion 509 so that the position of the getter 507 can be confirmed from the outside of the front base plate 502.

The shape of the getter-film-covered portion 509 may be circular, quadrilateral, polygonal, etc. The size of the getter-film-covered portion 509 may be equal to or slightly larger than that of the getter 507.

(c) Upon completion of the enclosing step, in which the outer casing 505 is assembled by the two base plates 502,503 and the side plates 504, and air inside the outer casing 505 is discharged, the getter 507 is heated by a high-frequency induction heater to form the getter film 510 on the getter-film-covered portion 509.

Assuming that barium, which generates a black color getter film, is selected as the getter substance, since the getter-film-covered portion 509, which is transparent as the insulating film 506 is taken out, will be shielded against light after the getter film is formed, it would be no fear that any bad influence is exerted on the display.

The double-faced vacuum fluorescent display of this embodiment has the following advantageous results:

(1) Since the position of the getter can be confirmed directly by naked eye from the outside of the outer casing, even an inexperienced person can heat only the getter precisely to form the getter film. As a result, it is possible to minimize occurrences of fault with the getter and to improve the rate of production.

(2) Since the formed getter film can be observed from the outside, it is possible to confirm readily whether or not the getter has been formed.

By selecting the first to fifth embodiments together in a desired combination, various modified double-faced vacuum fluorescent displays can be obtained. Such additional modifications should be covered within the scope of this invention.

What is claimed is:

1. A double-faced vacuum fluorescent display, comprising:

an outer casing including a base plate, a transparent front plate situated in front of the base plate, and a side member situated between the base plate and the front plate to form a space therebetween, a first display portion mounted on the base plate at an inner side of the outer casing, said first display portion including a wiring pattern situated on the base plate, an insulating layer with light shielding property disposed on the wiring pattern, a first anode conductor disposed on the insulating layer and connected to the wiring pattern, and a first fluorescent layer disposed on the first anode conductor, a display on the first display portion being able to see only from a side of the front plate, and a second display portion mounted on the transparent front plate at the inner side of the outer casing, said second display portion including a second anode conductor with transparency situated on the front plate and a second fluorescent layer disposed on the second anode conductor, and having a light transmitting portion for observing the first display portion therethrough so that light by the first fluorescent layer is observed from the light transmitting portion through the transparent front plate, and light by the second fluorescent layer is seen through the transparent front plate and the second anode conductor.

2. A double-faced vacuum fluorescent display according to claim 1, further comprising a plurality of external terminals extending through the outer casing, and a plurality of terminal portions mounted on the front plate and connected to the external terminals, at least a part of the terminal portions mounted on the front plate being transparent so that at least a part of the external terminals is observed through the front plate and the transparent part of the terminal portions.

3. A double-faced vacuum fluorescent display according to claim 2, wherein each of said part of the external terminals has a frame to surround the same, an inside of the frame being transparent.

4. A double-faced vacuum fluorescent display according to claim 1, further comprising first and second external terminals situated between the side member and one of the base plate and the front plate, said first display portion further including base-plate-side terminals mounted on the base plate at the inner side of the outer casing, said base-plate-side terminals being connected to the wiring pattern and contacting the first external terminals, and said second display portion further including front-plate-side terminals mounted on the front plate at the inner side of the outer casing and contacting the second external terminals.

5. A double-faced vacuum fluorescent display according to claim 4, wherein said first display portion further includes a first mesh grid situated over the first fluorescent layer at a predetermined distance away therefrom, and said second display portion further includes a second wiring pattern mounted on the front plate at the inner side of the outer casing and connected to the second anode conductor, and a second mesh grid situated over the second fluorescent layer at a predetermined distance away therefrom.

6. A double-faced vacuum fluorescent display according to claim 1, further comprising a plurality of external terminals extending through the outer casing, a plurality of terminal portions mounted on the front and base plates and connected to the external terminals, a shield film formed on an inner peripheral portion of at least one of the front plate and the base plate, said shield film having a through-hole at a portion facing at least one of the external terminals so that said at least one of the external terminals can be observed through the through-hole from an outside of the outer casing.

7. A double-faced vacuum fluorescent display according to claim 6, wherein the through-hole in the shield film is an elongated slot extending parallel to the external terminals.

8. A double-faced vacuum fluorescent display according to claim 6, wherein said shield film includes a plurality of through-holes extending parallel to the external terminals, said through-holes and the external terminals having same pitches.

9. A double-faced vacuum fluorescent display according to claim 1, wherein said first and second fluorescent layers are arranged to at least partly overlap with each other in a direction from the front plate to the base plate.

10. A double-faced vacuum fluorescent display according to claim 1, further comprising shield films mounted on the front plate and the base plate except the first and second display portions, a getter situated contiguously to said shield film, a getter-film-covered portion free of the shield film and formed in a part of an inner surface of the outer casing facing the getter, and a getter film mounted on the getter-film-covered portion.

* * * * *